United States Patent [19]

McCafferty et al.

[11] Patent Number: 5,079,455
[45] Date of Patent: Jan. 7, 1992

[54] SURGE CURRENT-LIMITING CIRCUIT FOR A LARGE-CAPACITANCE LOAD

[75] Inventors: Lory N. McCafferty; Raymond K. Orr, both of Kanata, Canada

[73] Assignee: Northern Telecom Limited, Montreal, Canada

[21] Appl. No.: 551,111

[22] Filed: Jul. 11, 1990

[51] Int. Cl.⁵ ............................ H03K 5/08; G05F 1/56
[52] U.S. Cl. ...................................... 307/568; 307/555; 307/363; 307/296.1; 361/11
[58] Field of Search ............... 307/362, 363, 540, 546, 307/547, 548, 553, 554, 555, 568, 296.1, 272.3; 361/10, 11, 31, 57, 2

[56] References Cited

U.S. PATENT DOCUMENTS

| | | | |
|---|---|---|---|
| 3,568,043 | 3/1971 | Rabus | 307/540 |
| 3,870,905 | 3/1975 | Chikazawa | 307/296.1 |
| 4,254,347 | 3/1981 | Ray | 307/296.1 |

Primary Examiner—John Zazworsky
Attorney, Agent, or Firm—R. John Haley

[57] ABSTRACT

A circuit for limiting switch-on surge current to a load including a large capacitance includes a MOSFET whose controlled path is connected in series with the capacitance across power supply terminals. A resistor and a capacitor, having a relatively small capacitance, are also connected in series with the controlled path, and a junction between the resistor and capacitor is connected to a gate of the MOSFET via a further resistor to provide a negative feedback path for charging the load capacitance with a constant current when power is applied. A further capacitor prevents initial turn-on of the MOSFET, and a zener diode limits the gate voltage. An alternative arrangement using a differential amplifier is described. The resistive part of the load can be connected in parallel with the load capacitance, or to the power supply terminals for which it can be separately switched in dependence upon the gate voltage.

11 Claims, 2 Drawing Sheets

SURGE CURRENT-LIMITING CIRCUIT FOR A LARGE-CAPACITANCE LOAD

This invention relates to a circuit for limiting current surges on switching on power to a load which includes a large capacitance.

BACKGROUND OF THE INVENTION

It is well known that, when a load having a capacitive component is connected to a source of power, there is a transient high current flow, or current surge, associated with the charging of this capacitive component to the voltage of the power source. In the absence of any current limiter, the magnitude of the surge is dependent upon the source impedance, which is usually low. With increasingly large capacitances being used, for example for effective supply voltage smoothing purposes, there is an increasingly large energy transient during the current surge.

Where, as is common in electronic equipment, a single power source is used to supply power to several loads, each of which may comprise a switching power supply, circuitry on a large printed circuit card, etc. with its own large smoothing capacitors, the current surge which occurs on connection or switch-on of power to one load can adversely affect the power source to such an extent that reliable operation of other loads is jeopardized. In addition, large current surges impose undesirable stresses on components such as fuses and wiring, and particularly connectors which may be subject to arcing.

Accordingly, it is known to limit the switch-on surge current in various ways. In one known method of limiting the surge current, a resistor with a negative temperature coefficient of resistance and a significant thermal time constant is connected in series with the load. On switch-on of power when the resistor is cold, its resistance limits the surge current, and as the resistor becomes hot in operation its resistance, and hence its power dissipation, falls. However, this simple arrangement is ineffective if the resistor is hot when the power is switched on. Power losses in the resistor, while being reduced in normal operation, may still be unacceptably high.

An alternative is to connect an inductor, which can be designed to provide very little power loss, in series with the load. However, in electronic circuits the necessary size and cost of such an inductor generally make this alternative undesirable.

A further alternative is to connect a resistor in series with the load to limit the current on power switch-on, and to connect a switch provided by relay contacts or a power transistor in parallel with the resistor to bypass it when the switch is closed. Closing of the switch is effected either after a fixed delay which is greater than the current surge period, or in response to the surge current falling below a threshold level. Such an arrangement may involve either an undesirably long delay or undesirably complicated or sensitive control circuitry for the switch.

An object of this invention, therefore, is to provide an improved current limiting circuit for a load including a large capacitance.

SUMMARY OF THE INVENTION

According to this invention there is provided a current limiting circuit for a load including a large capacitance, comprising: two terminals for connection to a power source; a transistor having a controlled path and a high impedance control input; a resistor; a capacitor having a capacitance much less than the load capacitance, the resistor, capacitor, and controlled path of the transistor being connected in series between the two terminals; means for connecting the load capacitance in parallel with the series-connected resistor and capacitor; and control means coupled between a junction between the series-connected resistor and capacitor and the control input of the transistor for controlling the transistor to supply a substantially constant current to the load capacitance in response to power being supplied to the terminals.

The transistor is preferably a MOSFET. In one embodiment of the invention the control means comprises a differential amplifier (50) responsive to differences between a voltage at the junction between the series-connected resistor and capacitor and a reference voltage for controlling the MOSFET. In another, simpler, embodiment of the invention the control means comprises a second resistor connected between the junction and a gate of the MOSFET constituting the control input, the second resistor having a resistance which is much less than that of the first resistor, and a second capacitor connected between the gate of the MOSFET and that one of the terminals to which the controlled path of the MOSFET is connected, the second capacitor having a capacitance which is significantly larger than the capacitance of the first capacitor.

In the latter embodiment, preferably a zener diode is connected in parallel with the second capacitor to limit the gate voltage of the MOSFET to permitted levels.

The invention also extends to the combination of a current limiting circuit as recited above with a load including said large capacitance and a resistance, the load capacitance being connected in series with the controlled path of the transistor. The load resistance can be connected either in parallel with the load capacitance, so that its current is conducted via the transistor, or it can be connected to the terminals. In the latter case the combination advantageously includes switching means for interrupting the connection of the load resistance to the terminals until the load capacitance is charged, such switching means for example comprising means responsive to a voltage at the gate of the MOSFET.

BRIEF DESCRIPTION OF THE DRAWINGS

The invention will be further understood from the following description with reference to the accompanying drawings, in which similar references are used in different figures to denote similar components and in which.

DESCRIPTION OF THE PREFERRED EMBODIMENTS

Figure 1:
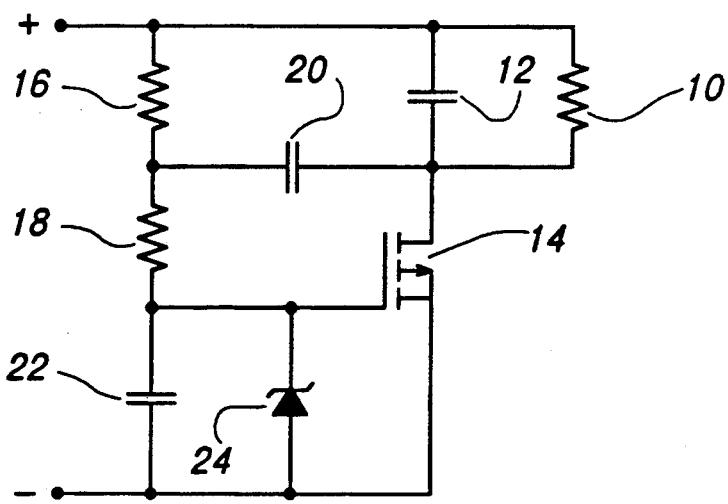
FIG. 1 is a circuit diagram illustrating a load and a current limiting circuit in accordance with an embodiment of the invention.

Referring to FIG. 1, positive and negative terminals of a power source (not shown) are represented by + and − signs respectively in conventional manner. A load to be supplied with power from the power source is represented diagrammatically by a resistor 10 and a capacitor 12 in parallel with one another, the capacitor 12 representing a capacitive component of the load. The remainder of the circuit of FIG. 1, comprising a power MOSFET (metal-oxide-semiconductor field-effect transistor) 14, resistors 16 and 18, capacitors 20 and 22, and a zener diode 24, constitute a surge current limiter as described below.

As illustrated in FIG. 1, the MOSFET 14 has its drain-source controlled path connected in series with the load resistor 10 and capacitor 12, and its gate-source path connected in series with the resistors 18 and 16, across the power source terminals. The capacitor 20 has one terminal connected to a junction between the two series resistors 16 and 18 and its other terminal connected to a junction between the MOSFET 14 and the load 10, 12. The capacitor 22 and zener diode 24 are connected in parallel with the gate-source path of the MOSFET 14, the former for providing a desired total capacitance (of the capacitor 22 in parallel with the MOSFET gate-source capacitance) and the latter for protecting the gate-source junction from excessive voltages in normal operation. It should be appreciated that the MOSFET 14 could itself be designed or selected to avoid the need for one or both of the components 22 and 24.

For operation of the circuit of FIG. 1 as described below, the resistance of the resistor 16 is much greater than that of the resistor 18, and the capacitance of the capacitor 22 is much less than that of the load capacitor 12 and significantly greater than that of the capacitor 20. Purely by way of example rather than limitation, the resistors 16 and 18 may have resistances of 2MΩ and 1kΩ respectively, and the capacitors 12, 20, and 22 may have capacitances of 4700 μF, 0.33 μF, and 10 μF respectively. The zener diode 24 may have a zener voltage Vz between the threshold and maximum voltages of the gate-source junction of the MOSFET 14, and the power source may provide a voltage of 48 V between the + and − terminals.

Figure 2:
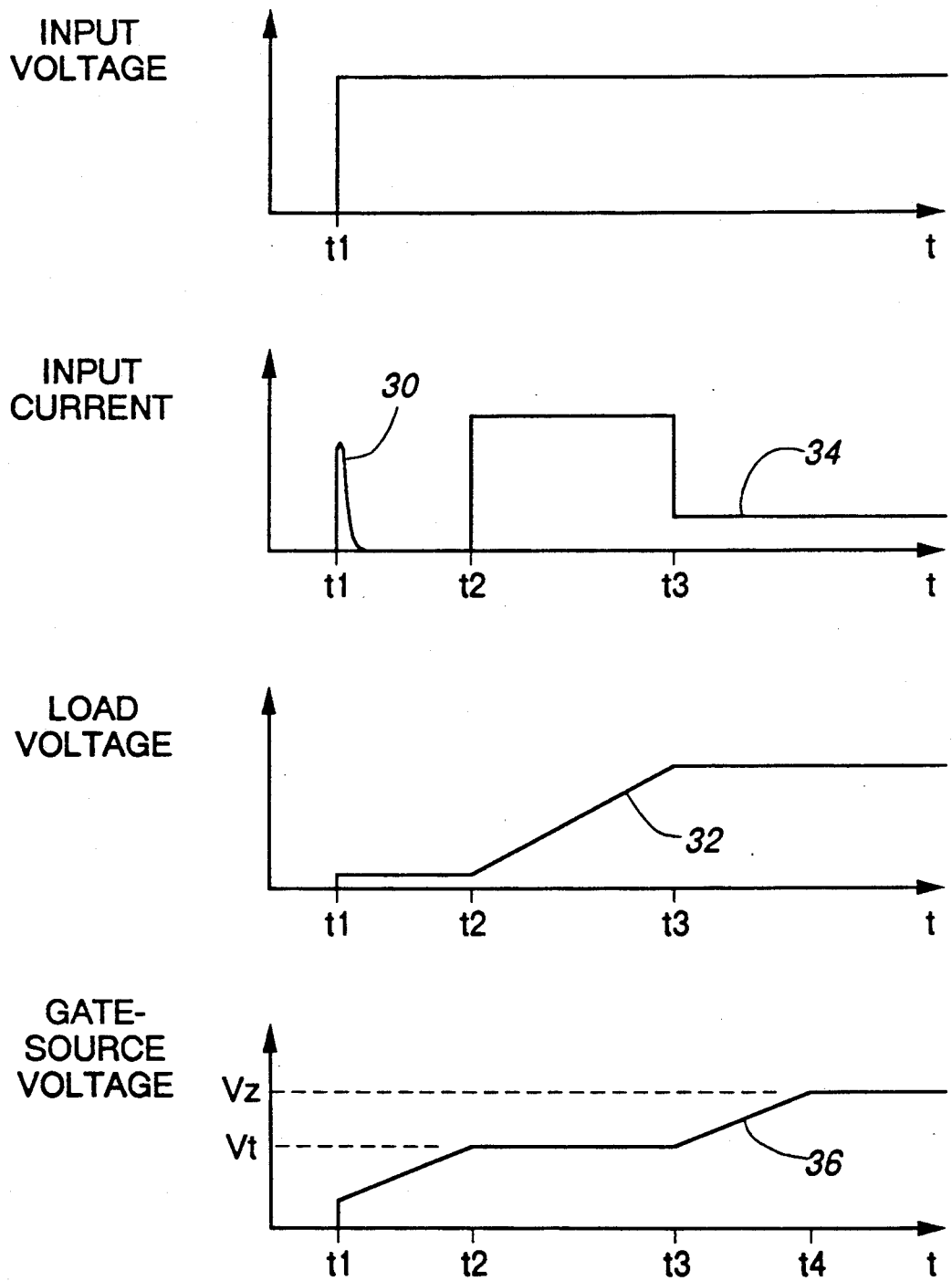
FIG. 2 illustrates voltage and current characteristics with reference to which the operation of the circuit of FIG. 1 is explained.

FIG. 2 illustrates voltage and current characteristics, as a function of time t, with reference to which the operation of the circuit of FIG. 1 is explained. From the top to the bottom, FIG. 2 illustrates (not to scale) the input voltage supplied by the power source to the terminals + and −, the input current drawn from the power source, the resulting load voltage across the load resistor 10 and capacitor 12, and the gate-source voltage which is present across the gate-source junction of the MOSFET 14.

Starting at a time t1 at which the power source is connected or switched on, there is an initial transient input current surge 30, of relatively small magnitude, due to current flowing via the capacitors 12 and 20, the resistor 18, and the capacitor 22 (which in the following description is assumed for simplicity to include the gate-source capacitance of the MOSFET 14). The resistor 16 conducts a negligible current at this time due to its high resistance. As the capacitor 20 has a much smaller capacitance than the capacitors 12 and 22, it determines with the resistance of the resistor 18 a short charging time constant for this current surge 30. In view of the relative capacitance values, the capacitor 20 is charged to nearly the full input voltage of the power supply, with only a small voltage (less than the gate-source threshold voltage Vt of the MOSFET 14, which is typically about 2 V) across the capacitor 22. Consequently the MOSFET 14 is not turned on at this time.

Following charging of the capacitor 20 and until a time t2, current flows via the series resistors 16 and 18 to charge the capacitor 22 until the threshold voltage Vt is reached. At the time t2, when the threshold voltage Vt is reached, the MOSFET 14 begins to conduct to charge the load capacitor 12. Thus the voltage at the junction between the capacitors 12 and 20 becomes more negative, and this voltage is fed back to the gate of the MOSFET 14 via the capacitor 20 and the resistor 18, tending to reduce the drive to the gate of the MOSFET. This negative feedback provides a controlled turning on of the MOSFET 14 between the time t2 and a time t3, at which the load capacitor 12 is fully charged to the input voltage and the MOSFET 14 saturates.

Between the times t2 and t3 there is negligible current flow through the resistor 18, due to the high impedance of the gate-source junction of the MOSFET 14, and the gate voltage is substantially constant. Consequently, during this period there is substantially no voltage drop across this resistor 18, and there is therefore a substantially constant voltage drop across the resistor 16. The resistor 16 therefore passes a constant current, so that the capacitor 20 is charged, and hence the load capacitor 12 is charged, at a linear rate 32 as shown by the load voltage between the times t2 and t3 in FIG. 2. The linear rate 32 corresponds to the constant rate of change of voltage due to the constant current flowing via the resistor 16 to the capacitor 20.

Following the time t3, the input current falls to a normal operating level 34, and the capacitor 22 continues to charge via the series resistors 16 and 18 as shown by the curve 36 until, commencing at a time t4, the zener diode 24 starts to conduct at the zener voltage Vz, to which the gate-source voltage of the MOSFET 14 is limited.

It can be appreciated that in the above arrangement, because the load capacitor 12 is charged with a constant current, a minimal charging time, and hence delay before the full input voltage is supplied to the load resistance 10, is achieved for any given load capacitance and maximum input current during the switch-on period.

Figure 3:
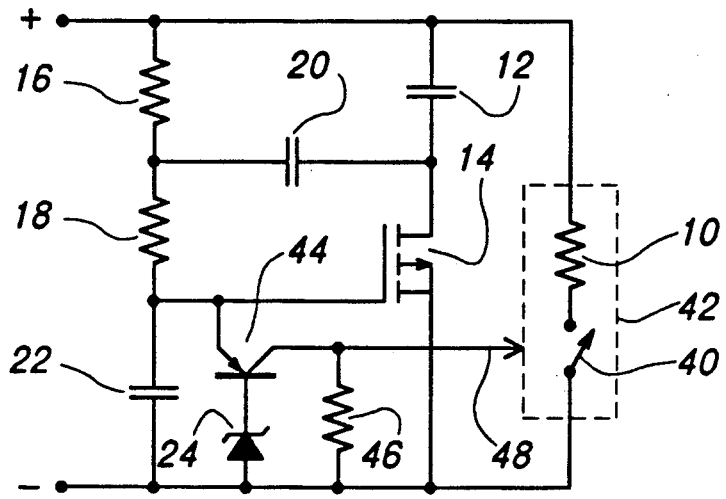
FIG. 3 is a circuit diagram illustrating a load and a current limiting circuit in accordance with another embodiment of the invention.

FIG. 3 illustrates an alternative circuit arrangement to that of FIG. 1, in that the load resistance 10 is connected across the series combination of the load capacitor 12 and the MOSFET 14, rather than across the capacitor 12 alone. This has the advantage that in normal operation the input current to the load resistor 10 does not flow through the MOSFET 14, although this is still conductive (saturated and with a low impedance) to provide the necessary connection of the load capacitor 12 to the load resistor 10.

In the circuit arrangement of FIG. 3, in order to prevent application of the supply voltage to the load resistor 10 before the capacitor 12 is charged, a switch 40, shown with the load resistor 10 as part of a composite load 42, is connected in series with the load resistor 10 to be closed only after charging of the capacitor 12. In the circuit illustrated, this is achieved at the time (t4 in FIG. 2) when the zener diode 24 starts to conduct, this being detected by a bipolar transistor 44 whose base-emitter junction is connected in series with the zener diode 24. A collector of the transistor 44 is connected via a load resistor 46 to the negative supply rail (− terminal) and as a control input on a line 48 to the load 42 for controlling the switch 40. In one particular application of this circuit, the load 42 may comprises a switching power supply, and the line 48 may comprise a logical control line for this supply.

In the above arrangements, the constant charging rate of the load capacitor 12 is dependent upon having a stable and constant level of input voltage. If the input voltage varies during the time that the capacitor 12 is charging, the voltage across the resistor 16 will also vary to produce a varying charging rate. In order to avoid this possibility, the circuit of FIG. 4 may be used.

Figure 4:
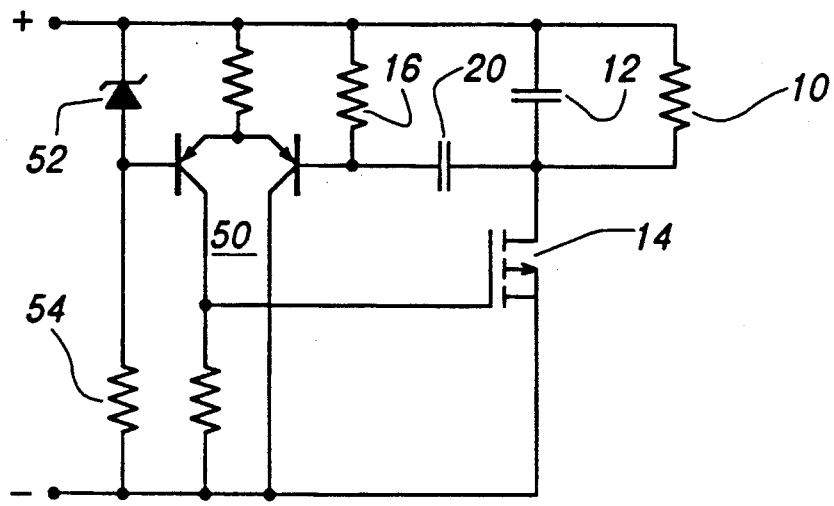
FIG. 4 is a circuit diagram illustrating a load and a current limiting circuit in accordance with a further embodiment of the invention.

In the circuit of FIG. 4, the negative feedback provided by the resistor 18 in FIG. 1, and the associated components 22 and 24, are replaced by a differential amplifier 50 of conventional form, together with a reference voltage source constituted by a zener diode 52 biased via a resistor 54. The differential amplifier compares the voltage dropped across the resistor 16 with the reference voltage, and controls the gate of the MOSFET 14 accordingly, to provide a linear charging rate for the load capacitor 12 in a similar manner to that described above.

Although particular embodiments of the invention have been described in detail above, it should be appreciated that numerous modifications, variations, and adaptations may be made without departing from the scope of the invention as defined in the claims. For example, although only a single load capacitor 12 has been referred to above, the same comments apply to the capacitors of a more complex filtering network.

What is claimed is:

1. A current limiting circuit for a load including a large capacitance (12), comprising:
   two terminals (+, −) for connection to a power source;
   a transistor (14) having a controlled path and a high impedance control input;
   a resistor (16);
   a capacitor (20) having a capacitance much less than the load capacitance, the resistor, capacitor, and controlled path of the transistor being connected in series between the two terminals;
   means for connecting the load capacitance in parallel with the series-connected resistor and capacitor; and
   control means coupled between a junction between the series-connected resistor and capacitor and the control input of the transistor for controlling the transistor to supply a substantially constant current to the load capacitance in response to power being supplied to the terminals.

2. A circuit as claimed in claim 1 wherein the transistor comprises a MOSFET.

3. A circuit as claimed in claim 2 wherein the control means comprises a second resistor (18) connected between the junction and a gate of the MOSFET constituting the control input, the second resistor having a resistance which is much less than that of the first resistor, and a second capacitor (22) connected between the gate of the MOSFET and that one of the terminals to which the controlled path of the MOSFET is connected, the second capacitor having a capacitance which is significantly larger than the capacitance of the first capacitor.

4. A circuit as claimed in claim 3 and including a zener diode (24) connected in parallel with the second capacitor.

5. In combination, a current limiting circuit as claimed in claim 1 and a load including said large capacitance (12) and a resistance (10), wherein the load capacitance and resistance are connected in parallel with one another both in series with the controlled path of the transistor.

6. In combination, a current limiting circuit as claimed in claim 3 and a load including said large capacitance (12) and a resistance (10), wherein the load capacitance and resistance are connected in parallel with one another both in series with the controlled path of the transistor.

7. In combination, a current limiting circuit as claimed in claim 1 and a load including said large capacitance (12) and a resistance (10), wherein the load capacitance is connected in series with the controlled path of the transistor and the load resistance is connected to the terminals (FIG. 3).

8. In combination, a current limiting circuit as claimed in claim 3 and a load including said large capacitance (12) and a resistance (10), wherein the load capacitance is connected in series with the controlled path of the transistor and the load resistance is connected to the terminals (FIG. 3).

9. The combination of claim 8 and including switching means (40) for interrupting the connection of the load resistance to the terminals until the load capacitance is charged.

10. The combination of claim 9 wherein the switching means comprises means (44) responsive to a voltage at the gate of the MOSFET.

11. A circuit as claimed in claim 2 wherein the control means comprises a differential amplifier (50) responsive to differences between a voltage at the junction between the series-connected resistor and capacitor and a reference voltage for controlling the MOSFET.

* * * * *